(12) United States Patent
Machida et al.

(10) Patent No.: US 7,205,765 B2
(45) Date of Patent: Apr. 17, 2007

(54) PARALLEL IMAGING BASED ON EXPANDED UNFOLDING TECHNIQUE

(75) Inventors: Yoshio Machida, Nasu-Gun (JP); Nobuyasu Ichinose, Otawara (JP); Shinichi Uchizono, Nasu-Gun (JP)

(73) Assignees: Kabushiki Kaisha Toshiba, Minato-ku, Tokyo (JP); Toshiba Medical Systems Corporation, Otawara-shi, Tochigi-ken (JP)

( * ) Notice: Subject to any disclaimer, the term of this patent is extended or adjusted under 35 U.S.C. 154(b) by 48 days.

(21) Appl. No.: 11/210,659

(22) Filed: Aug. 25, 2005

(65) Prior Publication Data

US 2006/0197527 A1 Sep. 7, 2006

Related U.S. Application Data

(62) Division of application No. 10/841,963, filed on May 10, 2004, now Pat. No. 7,102,351.

(30) Foreign Application Priority Data

May 8, 2003 (JP) .............................. 2003/130408

(51) Int. Cl.
*G01V 3/00* (2006.01)
(52) U.S. Cl. ....................... 324/318; 324/309
(58) Field of Classification Search ........ 324/300–322; 600/410–425; 382/128–131
See application file for complete search history.

(56) References Cited

U.S. PATENT DOCUMENTS 4,857,846 A 8/1989 Carlson 6,326,786 B1 12/2001 Pruessmann et al.
6,608,480 B1 8/2003 Weyers .................. 324/318

(Continued)

FOREIGN PATENT DOCUMENTS

EP 0132337 1/1985

(Continued)

OTHER PUBLICATIONS

King et al., "Iterative SENSE Reconstruction for Reduced Motion Artifacts", Proceedings of the International Society for Magnetic Resonance in Medicine. Scientific Meeting and Exhibition, May 2002, p. 2411, XP002303828.

(Continued)

*Primary Examiner*—Brij B. Shrivastav
(74) *Attorney, Agent, or Firm*—Nixon & Vanderhye, P.C.

(57) ABSTRACT

Parallel imaging is performed by a magnetic resonance imaging system provided with a multiple RF coil composed of plural element coils. As part of parallel imaging conditions, a desired imaging FOV and a reduction rate of data acquisition time for the parallel imaging are specified by an operator. An unfolding FOV to which an unfolding scale is assigned is specified. The unfolding scale is larger in value than the reduction rate, thus the unfolding FOV is larger in the size than the imaging FOV. Using an acquisition FOV specified based on the imaging FOV and the reduction rate, a scan for parallel imaging is performed and images are reconstructed corresponding to the respective element coils. The reconstructed images are unfolded into an unfolding-FOV image at the unfolding scale. An image having the imaging FOV is cut out, as a desired final image, from the unfolded image.

72 Claims, 8 Drawing Sheets

U.S. PATENT DOCUMENTS

| | | |
|---|---|---|
| 6,628,980 B2 | 9/2003 | Atalar et al. ................ 600/423 |
| 6,717,406 B2 * | 4/2004 | Sodickson ................... 324/307 |
| 6,771,071 B1 * | 8/2004 | Wright et al. ............... 324/318 |
| 6,822,450 B2 | 11/2004 | Klinge et al. ............... 324/318 |
| 6,841,998 B1 | 1/2005 | Griswold .................... 324/309 |
| 6,842,001 B2 | 1/2005 | Ikezaki ....................... 324/309 |
| 6,876,201 B2 | 4/2005 | Takizawa et al. ........... 361/685 |
| 6,965,232 B2 * | 11/2005 | Sodickson ................... 324/307 |
| 7,002,344 B2 * | 2/2006 | Griswold et al. ........... 324/309 |
| 7,019,523 B2 * | 3/2006 | Ikezaki ....................... 324/309 |
| 7,026,818 B2 * | 4/2006 | Machida et al. ............ 324/322 |
| 7,095,229 B2 * | 8/2006 | Lorenz ........................ 324/309 |
| 7,102,351 B2 * | 9/2006 | Machida et al. ............ 324/318 |

FOREIGN PATENT DOCUMENTS

| | | |
|---|---|---|
| EP | 0347995 A1 | 12/1989 |
| EP | 1293794 A2 | 3/2003 |
| WO | WO 03/046598 A1 | 6/2003 |

OTHER PUBLICATIONS

Goldfarb et al., "Field-of-View Restrictions for Artifact-free SENSE Imaging", Proc. Intl. Soc. Mag. Reson. Med. 10, 2002, XP002333091.
Patent Abstracts of Japan, vol. 017, No. 400, Jul. 27, 1993, & JP 05 076518 A, Mar. 30, 1993.
Patent Abstracts of Japan, vol. 017, No. 349, Jul. 2, 1993 & JP 05 049619 A, Mar. 2, 1993.
European Search Report—Jun. 23, 2005.
Pruessmann et al., SENSE: Sensitivity Encoding for Fast MRI:, Magnetic Resonance in Medicine 42:952-962 (1999).
Ra et al., "Fast Imaging Using Subencoding Data Sets from Multiple Detectors", pp. 142-145, MRM 30, (1993).

* cited by examiner

PARALLEL IMAGING BASED ON EXPANDED UNFOLDING TECHNIQUE

This is a division/continuation of our copending commonly assigned application Ser. No. 10/841,963 filed May 10, 2004, now U.S. Pat. No. 7,102,351.

BACKGROUND OF THE INVENTION

1. Technical Field of the Invention

The present invention relates to a magnetic resonance imaging (MRI) apparatus capable of performing parallel imaging (PI). In particular, the present invention relates to both of the magnetic resonance imaging systems and parallel imaging method which reduce artifacts inherent to the parallel imaging by improving a post-processing unfolding technique.

2. Related Art

Magnetic resonance imaging constructs images from MR signals emanated from an object in response to magnetically excited nuclear spins of the object in a static magnetic field at a Larmor frequency of the spin.

In the field of magnetic resonance imaging, study of fast imaging has become active. For example, a fast imaging technique called in general parallel imaging has been known, which requires a multiple RF coil consisting of a plurality of RF coils (i.e., element coils). This parallel imaging technique has historically been called "multicoil fast imaging technique," "PPA (Partially Parallel Acquisition) technique," and/or "subencoding technique."

Parallel imaging can be performed in a variety of modes, which include (1) a technique of calculating data to be skipped in k-space; (2) a technique of unfolding data in real space (called a "subencoding technique" or a "SENSE technique"), and (3) a technique of combining Sum-Of-Square images (called a "PILS technique) formed from the subencoding or SENSE technique. Techniques belonging to mode (2) have been known by such references as "Ra J. B. and Rim C. Y., Fast Imaging Method Using Multiple Receiver Coils with Subencoding Data Sets, ISMRM p. 1240, 10991"; "Ra J. B. and Rim C. Y., Fast Imaging Using Subencoding Data Sets From Multiple Detectors, MRM 30:142–145, 1993"; "Pruessman K. P., Weiger M., Scheidegger M. B., and Boesiger P., SENSE: Sensitivity Encoding for Fast MRI, MRM 42:952–962, 1999"; and "Japanese patent publication No. W099/54746(1998)".

Basically, these techniques for parallel imaging uses an array coil (hereinafter referred to as Phased Array Coil: PAC) composed of a plurality of RF coils (i.e., element coils), which is one kind of a multiple RF coil, and adopts subencoding acquisition. This subencoding acquisition requires that phase encoding be skipped every so many predetermined steps, so that the total number of phase encoding steps is reduced down to an amount equal to "1/the number of RF coils" from the predetermined number of phase encoding steps otherwise necessary for reconstructing an ordinary image (i.e., with no skipped phase encoding steps.

The respective RF coils receives echo signals in a concurrent manner. The echo signals received by each RF coil are used to produce a set of image data. Hence a FOV (field of view) of each image, which is produced from echo signals acquired by each RF coil having a smaller individual FOV, whereby scan time is shortened for fast imaging.

However, such an image produced using echo signals acquired by each RF coil includes wrap-around or folding (which is also called "aliasing") in edge regions of each image. In parallel imaging, the fact that plural RF coils have different sensitivity distributions is thus utilized to perform, as post-processing, unfolding to unfold each image acquired using each RF coil. This unfolding is processed based on the spatial sensitivity maps of the RF coils.

A plurality of pieces of images, which have been subjected to unfolding processing, are then combined into a final full-FOV image. Therefore, the parallel imaging technique is able to accelerate to a fast scan (i.e., fast imaging) and finally provide wide FOV-images covering, for example, the whole abdominal area of an object to be scanned.

However, as described above, in the case of the parallel imaging, it is theoretically inevitable that each image acquired using each RF coil is subjected to the folding phenomenon. There is a problem in that there remain artifacts due to the folding, which are known as back-folding, as long as the existence region of an object to be scanned is within an FOV specified as one imaging parameters.

To be specific, conventional parallel imaging plans a scan, in which conditions of unfolding processing are decided according to a final image specified by an operator with the use of such parameters as ROI, matrix size, FOV given during an imaging plan. The final image is normally rectangular in the shape. The decided unfolding processing conditions are used to produce unfolded images. In order to perform the unfolding processing in a preferable manner, operators should specify the size of a ROI (region of interest) exactly including the existence region of each object to be scanned. However, in practical clinical examinations, exactly specifying such ROIs becomes a considerable burden on operators. It is thus easier for operators to roughly specify the ROIs, resulting in back-folding artifacts occasionally occurring and deteriorating image quality for interpretation.

With reference to FIGS. 1A to 1C, such conditions will now be detailed.

FIG. 1A illustrates one conventional example in which a ROI defining a region subjected to an MR scan is set in a proper manner. A ROI is given so as to completely cover an object to be scanned and imaging conditions are given through a scan plan, before the subencoding technique is applied to data acquisition from the object. In this example, the subencoding technique is performed with the number of phase encoding steps reduced to one half of that required for standard Fourier imaging, so that the reduction rate of data acquisition time is 2 (i.e., two-fold speed). The folding, in this example, will cause superposition at two positions between adjacent folded FOVs. Hence, applying the unfolding processing on the assumption that two positions between adjacent folded FOVs are merely superposed with each other provides an image with no folded FOVs.

On the other hand, FIG. 1B illustrates another conventional example in which a ROI for imaging is set improperly. To be specific, during a scan plan for setting various imaging parameters, the ROI has been placed to specify an FOV (corresponding to the size of a desired final image) smaller than the actual existence region of an object to be scanned. In this example, when performing a scan at the foregoing two-fold speed, the folding will cause, in part, superposition between two folded FOVs, that is, superposition of three positions belonging to the three FOVs. This folding cannot be removed even if the unfolding processing on the foregoing two-fold speed is executed.

FIG. 1C exemplifies a conventional plan carried out in the manner shown in FIG. 1B, but subjected to imaging other than parallel imaging. However, in the example shown in FIG. 1C, since folding is caused only at edges of the FOV, there occurs no serious diagnostic problem in observing the final image.

When making reference to only FIGS. 1A to 1C, it may seem that the foregoing problem can easily be removed by merely setting, during a scan plan, a rectangular FOV slightly larger than a final-image desired size. In practice, however, the elimination of the problem will not be so simple. A multi-slice imaging technique is frequently adopted in the actual clinical application, where a ROI on one or more slices other than a slice used for a scan plan may be set to be less than the existence region of an object. Namely the existence region is beyond the FOV given through the ROI that has been set, like FIG. 1B. Hence the current situation is that it is not easy to always set a proper ROI. FIG. 2 illustrates such an undesirable situation, in which one of the slices suffers from the fact that a ROI is given improperly.

In imaging the heart, scans are normally made along the minor axis, major axis, and/or sections in the four chambers. FIGS. 3A and 3B pictorially illustrate some types of imaging of the heart along the minor axes thereof. However, this imaging also frequently suffers the foregoing problem, because the sectional shapes themselves of the heart are complicated and sections differ largely patient by patient. In addition, the same problem may occur in imaging a baby in the womb, because it is required that a section to be scanned coincide with the baby's orientation.

Even for imaging a coronal image of the trunk, it appears to be a reality that it is difficult to plan a proper FOV completely including a desired trunk section, because the arms positioned by the trunk extend largely in the lateral direction.

As understood from the above, a proper scan plan for the parallel imaging technique is not always carried out.

SUMMARY OF THE INVENTION

The present invention has been made with due consideration to the foregoing difficulties, and an object of the present invention is to provide a magnetic resonance imaging system and a method for parallel imaging that (i) provides stable and reliable reconstructed images (leading to a high-quality final image) with unfolding artifacts removed or suppressed steadily, regardless of how an FOV specified as an imaging region during a scan plan is positionally related to an object's existence region and (ii) alleviates operator's labor and time necessary for specifying the FOV (broadly, the scan plan) so that patient throughput is improved.

In order to accomplish the above object, the magnetic resonance imaging system and the method for parallel imaging responds to an FOV (i.e., imaging FOV or planned FOV) specified as an imaging region by an operator during a scan plan, the response being outlined as follows. An intervening virtual FOV for unfolding (called "unfolding FOV"), the size of which is larger than that of the FOV specified during the scan plan, is automatically specified by the magnetic resonance imaging system. In the system, this unfolding FOV is subjected to unfolding, into an intervening image, reconstructed images acquired by parallel imaging. A final image having the operator-specified FOV (i.e., imaging FOV or planned FOV) or a further FOV relating to the operator-specified FOV is cut out from the intervening image on the unfolding FOV. Hence a desired final image on the parallel imaging can be obtained using the intervening FOV.

Practically, the present invention provides, as one aspect, a magnetic resonance imaging system provided with a multiple RF coil composed of a plurality of element coils and configured to use the multiple RF coil to perform parallel imaging with an object to be imaged. The system comprises an imaging FOV specifying unit specifying a desired imaging FOV (Field Of View); an acquisition FOV specifying unit specifying an acquisition FOV on a basis of the imaging FOV, the acquisition FOV being used in performing a scan for parallel imaging; an unfolding FOV specifying unit specifying an unfolding FOV larger in size than the imaging FOV; an image acquisition unit configured to perform the scan with the object on a basis of the acquisition FOV so that a reconstructed image having the acquisition FOV is acquired for every element coil in response to the scan; an unfolding processing unit configured to apply, on a basis of the unfolding FOV, unfolding processing to the acquisition-FOV reconstructed image acquired by the image acquisition unit so that the acquisition-FOV reconstructed image is unfolded to provide an image having the unfolding FOV; and an image producing unit producing an image having the imaging FOV from the unfolding-FOV image obtained by the unfolding processing unit.

In this configuration, it is preferred that the imaging FOV specifying unit includes a unit for specifying imaging conditions for parallel imaging including both the imaging FOV and a reduction rate of data acquisition time for parallel imaging, the acquisition FOV specifying unit is configured to specify an acquisition FOV directed to the scan for parallel imaging depending on the reduction rate, the unfolding FOV specifying unit being configured to specify an unfolding scale (i.e., a rate for unfolding reconstructed images that are wrapped around) assigned to the unfolding FOV, the unfolding scale being larger in numerical value than the reduction rate, and the image producing unit being configured to produce the imaging-FOV image by cutting out the imaging-FOV image from the unfolding-FOV image obtained by the unfolding processing unit.

Preferably, the unfolding scale assigned to the unfolding FOV is an integer larger in a numerical value than the reduction rate specified as part of the imaging conditions. Hence the unfolding FOV is expanded more than the imaging FOV.

The present invention provides, as another aspect, a magnetic resonance imaging system provided with a multiple RF coil composed of a plurality of element coils and configured to use the multiple RF coil to perform parallel imaging with an object to be imaged. The system comprises an imaging condition specifying unit specifying imaging conditions including an imaging FOV for parallel imaging and a reduction rate of data acquisition time for parallel imaging; a scan unit performing a scan for parallel imaging to acquire echo signal from the element coils; a reconstruction unit reconstructing, into images, the echo signals detected by the element coils; an unfolding unit unfolding the reconstructed images into an unfolded image at an unfolding scale lager than the reduction rate; and an image cutting-out unit cutting out an image having the specified imaging FOV from the unfolded image.

In this case, it is preferred that the unfolding scale is an integer larger than the reduction rate, thus providing an unfolding FOV that is expanded more than the imaging FOV.

Further, the present invention provides, as another aspect, a method of performing parallel imaging by a magnetic resonance imaging system provided with a multiple RF coil composed of a plurality of element coils and configured to use the multiple RF coil to perform parallel imaging with an object to be imaged, comprising: specifying a desired imaging FOV (Field Of View); specifying an acquisition FOV on a basis of the imaging FOV, the acquisition FOV being used in performing a scan for parallel imaging; specifying an unfolding FOV larger in size than the imaging FOV; performing the scan with the object on a basis of the acquisition FOV so that a reconstructed image having the acquisition FOV is acquired for every element coil in response to the scan; applying, on a basis of the unfolding FOV, unfolding processing to the acquisition-FOV reconstructed image so that the acquisition-FOV reconstructed image is unfolded to provide an image having the unfolding FOV; and producing an image having the imaging FOV from the unfolding-FOV image.

In this way, for performing the unfolding processing in parallel imaging, the present exemplary embodiments adopts the "expanded unfolding technique" (so-termed by the present inventors), which is a technique of virtually expanding a region to be unfolded. Hence, however an operator specifies a region to be imaged in a scan plan, the unfolding processing can be carried out to provide an optimum result at any time. It is therefore possible to reduce, to a great extent, without fail, artifacts due to the unfolding phenomenon inherent to parallel imaging. An operational burden on operators can also be alleviated, which will lead to a stable supply of high-quality images, thereby enhancing the usefulness of parallel imaging.

DETAILED DESCRIPTION OF PREFERRED EMBODIMENTS

With reference to accompanying drawings, a magnetic resonance imaging (MRI) apparatus according to various embodiments of the present invention will now be described.

First Embodiment

Referring to FIGS. 4 to 8, a magnetic resonance imaging system according to a first embodiment of the present invention will now be described. In the present embodiment, this magnetic resonance imaging system will be explained as a system capable of performing parallel imaging.

Figure 1:
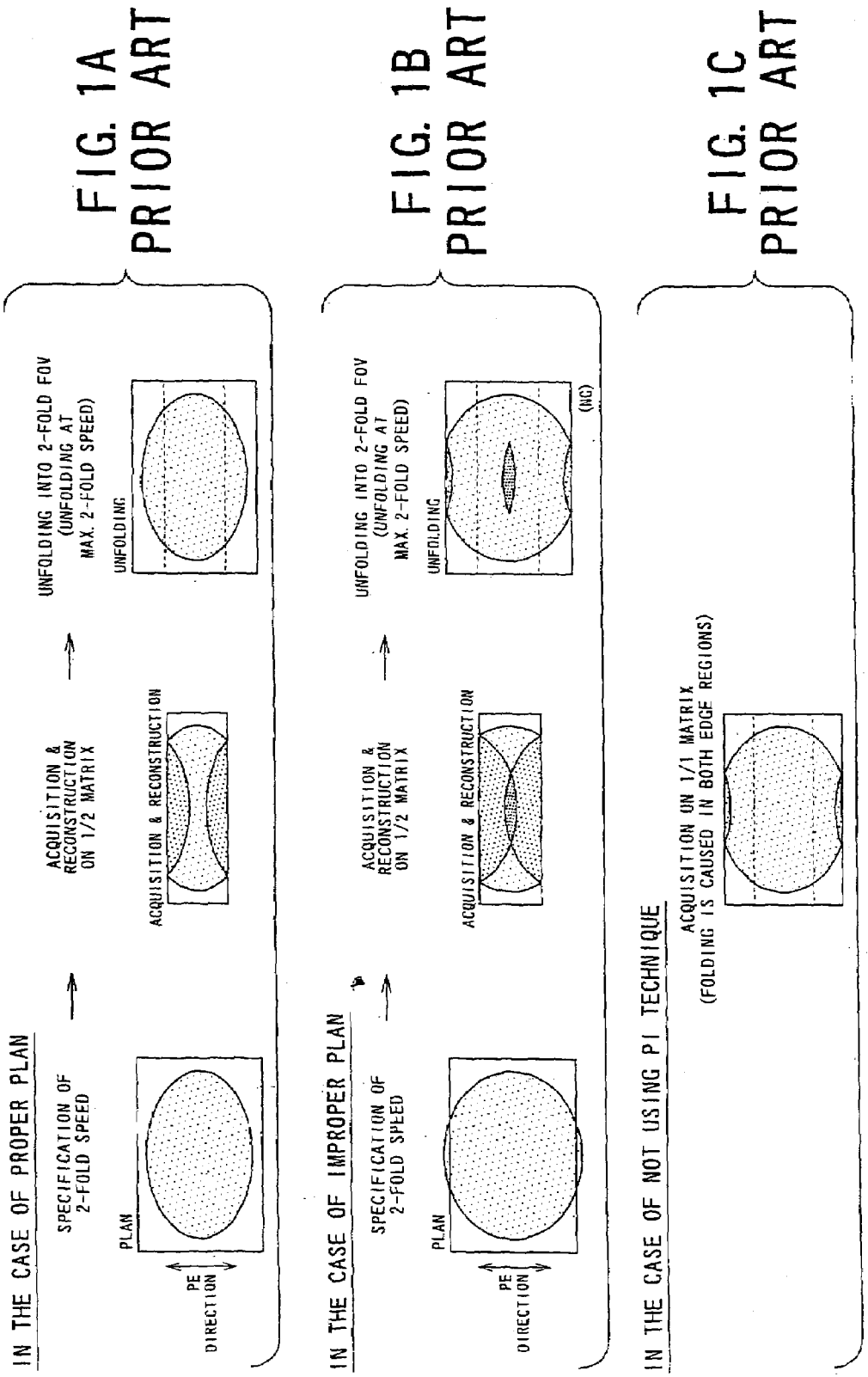
FIGS. 1A to 1C explain conventional unfolding techniques for parallel imaging, respectively.
Figure 2:
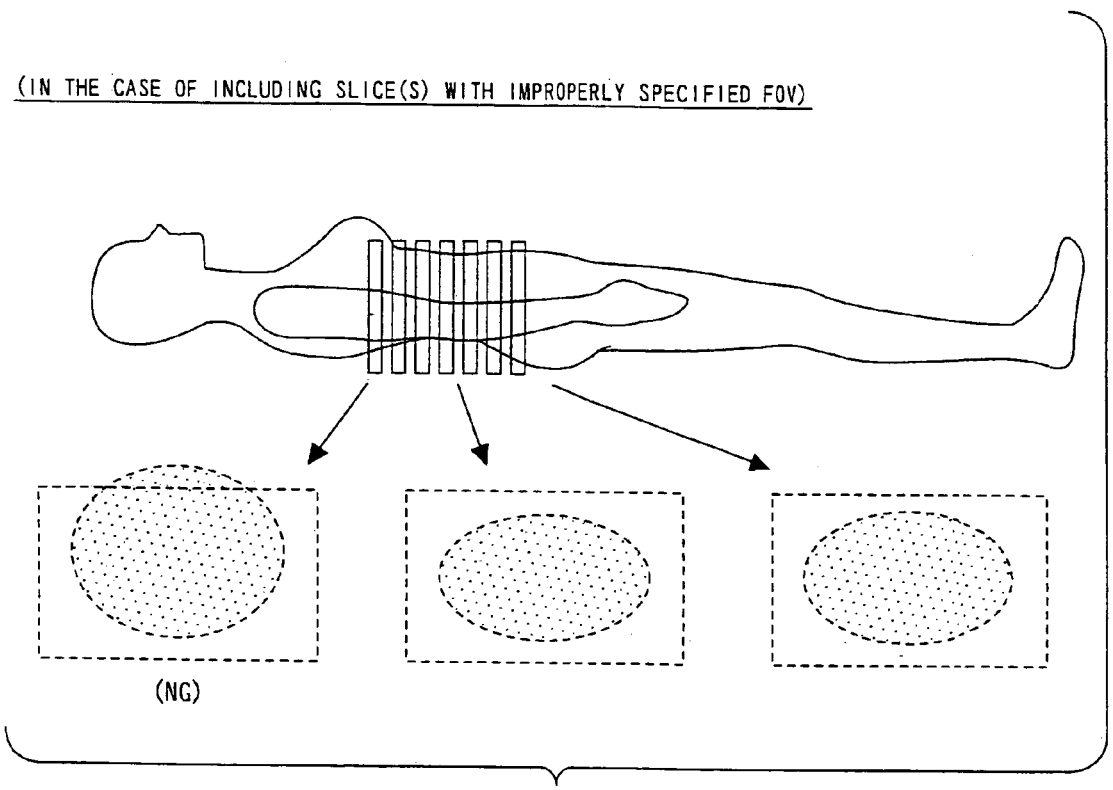
FIG. 2 explains a drawback with respect to conventional unfolding techniques for parallel imaging.
Figure 3A:
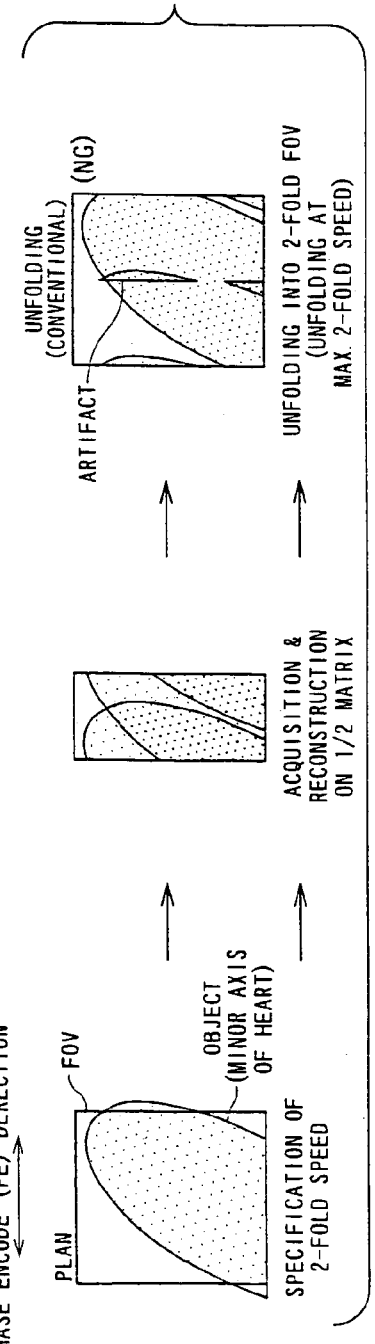
FIGS. 3A and 3B are other illustrations for explaining a drawback with respect to conventional unfolding techniques for parallel imaging.
Figure 3B:
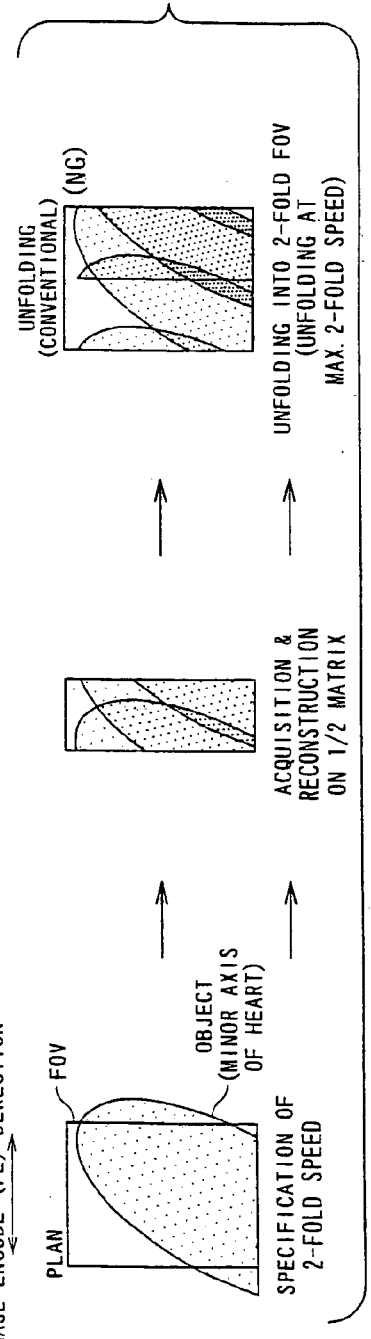
Figure 4:
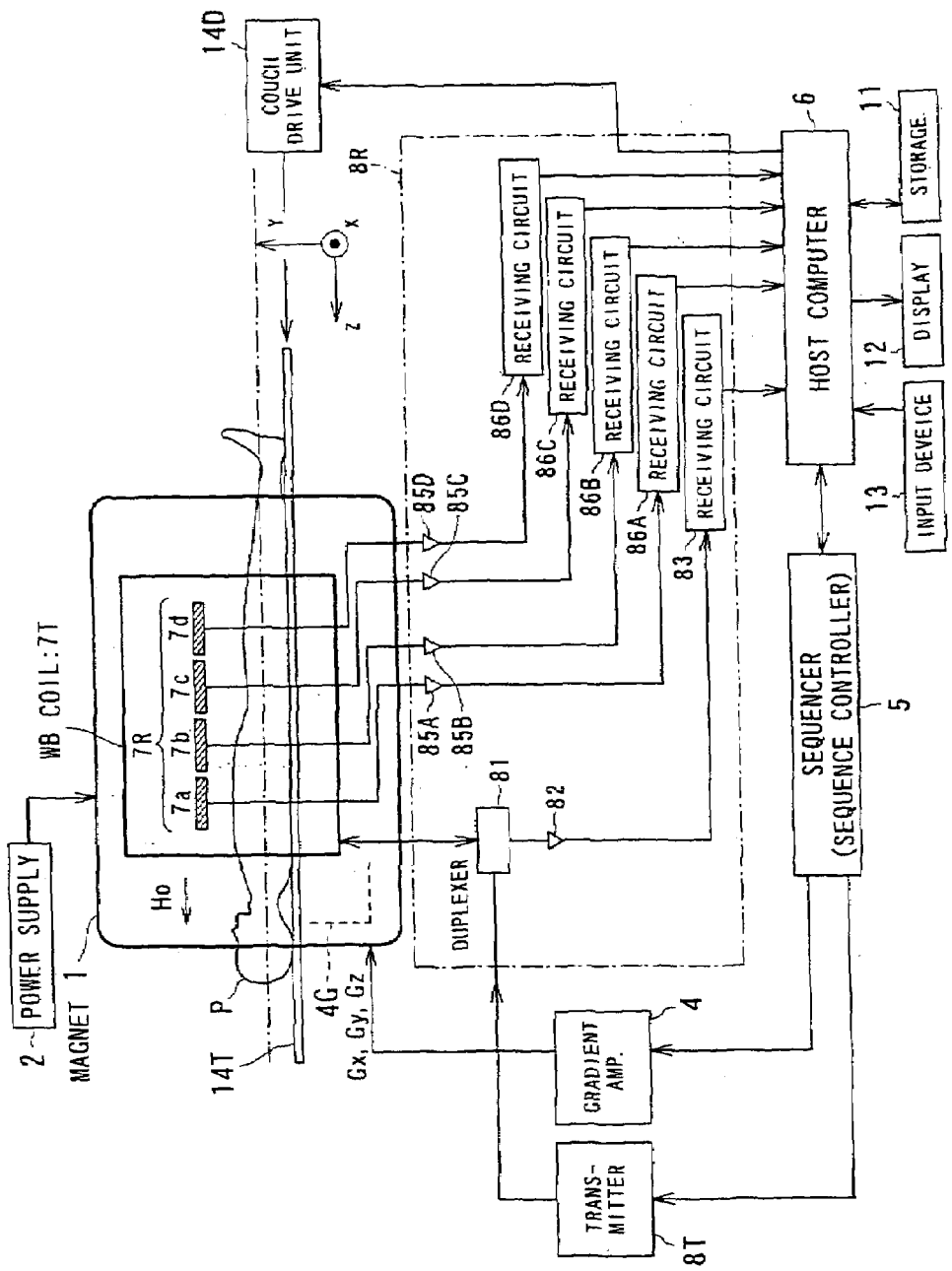
FIG. 4 is a functional block diagram exemplifying the configuration of a magnetic resonance imaging system according to an example of the present invention.

At first, referring to FIG. 4, the overall configuration of a magnetic resonance imaging system according to the present embodiment will now be outlined.

The magnetic resonance imaging system is provided with a multiple RF coil and performs parallel imaging using the multiple RF coil to produce MR images. As shown in FIG. 4, this system is also provided with a couch block, a static magnetic field generating block for generating a static magnetic field, and a gradient generating block for adding position information to the static magnetic field. The system is also provided with a transmission/reception block for transmitting and receiving RF signals and a control/calculation block that is in charge of control of the overall system and image reconstruction.

Of these components, the static magnetic field generating block is provided with a magnet 1 constructed by employing for example a superconducting magnet and a static power supply 2 supplying current to the magnet 1. By these devices, a static magnetic field $H_0$ is produced in an axial direction of a cylindrical bore (a space for diagnosis) into which an object P to be imaged is inserted. In the orthogonal coordinate axes assigned to the system, the axial direction agrees with the Z-axis direction. In addition, this generation block is also provided with a not-shown shimming coil to which current is supplied from a shimming coil power supply to shim the static magnetic field.

The couch block is configured to have a not-shown patient couch and a tabletop 14T that is able to slidably travel along the upper surface of the patient couch and to be driven by a couch drive unit 14D. The object P is laid on the tabletop 14T and can be inserted and returned into and from the bore of the magnet 1. The couch drive unit 14D performs this insertion and return. That is, the couch drive unit 14D responds to a drive signal given by a host computer 6 later described so as to move the tabletop 14T along its longitudinal direction (i.e., the Z-axis direction). The object P is laid on the tabletop 14T along its longitudinal direction, for example.

The gradient generating block has a gradient coil unit 4G incorporated in the magnet 1. The gradient coil unit 4G includes not-shown three sets (types) of x-, y-, and z-coil for generating gradient magnetic fields (gradients) in the X-, Y-, and Z-axes directions that are orthogonal one another. This gradient generating block is further provided with a gradient amplifier 4 to supply currents to each of the x-, y-, and z-coils. The gradient amplifier 4 supplies those coils with pulsed currents to generate gradients under the control of a sequencer 5 later described.

Controlling pulsed currents supplied from the gradient amplifier 4 to the x-, y-, and z-coils enables the mutually-orthogonal X-, Y-, and Z-directional gradients, which are gradients in the physical axes, to be synthesized. Thus mutually-orthogonal logic directional gradients, i.e., a slice gradient Gs, phase-encode gradient Ge, and read-out (frequency encoding) gradient Gr can be set or changed in an arbitrary manner. The gradients in the slice, phase-encode, and read-out directions are superposed on the static field $H_0$.

The transmission/reception block is provided with a whole-body (WB) coil 7T and receiving multiple RF coils 7R, both of which are formed as RF coils, and a transmitter 8T and a receiver 8R both connected to the coils 7T and 7R. The coils 7T and 7R are disposed in the vicinity of the object P placed in the space for diagnosis formed within the bore of the magnet 1.

The whole-body coil 7T is used in common for transmission and reception of RF signals in cases where the coil 7T is employed as the sole RF coil. By contrast, when employing the multiple RF coils 7R (serving as a reception coil), the whole-body coil 7T is used as a RF coil dedicated to transmission of RF signals.

The multiple RF coil 7R, which is formed as a whole as an array type of coil of which S/N (signal-to-noise ratio) can be set higher, is composed of a plurality of RF coils 7a, 7b, 7c and 7d each of which is an element coil. In the present embodiment, the four RF coils 7a, 7b, 7c and 7d (that is, four detecting channels) are adopted and each of the RF coils 7a to 7d is formed as a surface coil shaped, for example, into a circle or rectangle. The sizes and shapes of the RF coils 7a to 7d are decided such that those four-channel RF coils are able to cover a desired FOV (corresponding to a region of interest).

The output signals from those four-channel RF coils 7a to 7d are supplied to a receiver 8R (composing part of the transmission/reception block) independently of each other.

The coil configuration shown in FIG. 4 pictorially illustrates the four-channel RF coils 7a to 7d arranged along the body surface of the object P. However, the multiple RF coil 7R is not always limited to a coil configuration composed of plural surface coils, as described above, but may be composed of plural volume coils or of a QD (Quadrature) coil. As another modification, the multiple RF coil may be attached to the couch or object.

The transmission/reception block will now be described. This block is provided with a transmitter 8T and the receiver 8R, which are operative under the control of a sequencer 5 later described.

The transmitter 8T supplies to the whole-body coil 7T RF pulsed currents of which frequency is set to a Larmor frequency to cause nuclear magnetic resonance (NMR) at magnetic spins of the object P. In contrast, the receiver 8R receives an echo signal (RF signal) received by the whole-body coil 7T or multiple RF coil 7R, and then processes it into echo data (i.e., original data).

Specifically, the receiver 8R is divided, as shown in FIG. 4, into a reception part for the whole-body coil and a further reception part for the multiple RF coils.

The reception part for the whole-body coil includes a duplexer 81 connected with the whole-body coil 7T, a preamplifier 82 connected to the duplexer 81, and a receiving circuit 83 receiving a reception signal from the preamplifier 82. The duplexer 81 is coupled with the transmitter 8T as well.

This connection permits the duplexer 81 to pass a transmission drive pulse from the transmitter 8T to the whole-body coil 7T in transmission timing, while to pass an echo signal detected by the whole-body coil 7T to the preamplifier 82 in reception timing. The preamplifier 82 pre-amplifies the received echo signal to send the amplified signal to the receiving circuit 83. This circuit 83 performs various types of signal processing on the inputted echo signal, the processing including intermediate-frequency conversion, phase detection, low-frequency amplification, and filtering. In the circuit 83, the processed signal is then subject to A/D conversion to be produced into echo data (original data), before being sent to the host computer 6.

In contrast, the reception part for the multiple RF coils is provided with four-channel preamplifiers 85A to 85D and four-channel receiving circuits 86A to 86D, which are connected serially in every reception channel. The output terminals of all the receiving circuits 86A to 86D are electrically connected to the host computer 6. Hence in the reception part for the multiple RF coils, four-channel echo signals detected by the four-channel RF coils 7a to 7d are routed to the receiving circuits 86A to 86D via the amplifiers 85A to 85D, respectively. Like the foregoing, in each of the receiving circuit 86A to 86D, the inputted echo signal is subjected to various types of processing, such as intermediate-frequency conversion, phase detection, low-frequency amplification, and filtering. Further, in each receiving circuit 86A (to 86D), the processed echo signal further undergoes A/D conversion to be produced into echo data. The thus-processed echo data is then sent from each of the receiving circuits 86A to 86D to the host computer 6.

The control/calculation block will now be explained, which includes a sequencer 5 (also called sequence controller), host computer 6, storage 11, display 12, and input device 13.

Of these components, the host computer 6 operates based on software procedures memorized in its inner memory and/or the storage 11. The operations of the host computer 6 include various types of preparation scans for parallel imaging, a scan plan, an imaging scan, and a set of procedures for post-processing. The preparation scans include a pilot scan for positioning, a shimming scan for informing the static magnetic field, and a sensitivity-map scan for measuring a sensitivity map of each element coil (i.e., each RF coil 7a (to 7d)) used for unfolding. When the preparation scans and the imaging scan are performed, the host computer 6 provides the sequencer 5 with pulse sequence information necessary for those scans.

Moreover, the host computer 6 performs a variety of types of processing. One type of processing is a man-to-machine interface. During a scan plan, the host computer 6 is able to function, in conjunction with both the display 12 and input device 13, as an interface between an operator and the system. This interface function allows the operator to information about the scan plan to the system in an interactive manner. The scan plan includes the specification of imaging conditions (parameters), such as the phase-encode direction and the position, size and shape of a desired FOV in the parallel MR imaging.

Other types of processing are computing functions, which include the estimation of a sensitivity map of each of the RF coils 7a to 7d that compose the multiple RF coil 7R, the calculation of image data by applying reconstruction processing to the acquired echo data, and the control of drive of the couch drive unit 14D.

The pulse sequence information is specified to make a scan produce one or more sets of echo data necessary for reconstructing one or more images, once the scan is carried out on the pulse sequence information. The pulse sequence is a sequence on either a three-dimensional (3D) scan or a two-dimensional (2D) scan. As practical modes of pulse trains which can be employed, provided are an SE (spin echo) method, FSE (fast spin echo) method, FASE (fast asymmetric SE) method (that is, the FSE method combined with a half-Fourier method), EPI (echo planar imaging) method, FE (gradient field echo) method, FFE (fast FE) method, segmented FFE method, and others.

The sequencer 5 has a CPU and memories and memorizes pulse sequence information sent from the host computer 6. Based on this information, the sequencer 5 controls the operations of the gradient amplifier 4, transmitter 8T, and receiver 8R. The pulse sequence information is all kinds of information necessary for operating the gradient amplifier 4, transmitter 8T, and receiver 8R according to a series of pulse sequences that is specified. For instance, the pulse sequence information includes pieces of information concerning magnitudes of pulsed currents applied to the x-, y-, and z-coil, durations of application of the pulses, and application timing.

Data of images reconstructed and combined in the parallel imaging are displayed on the display 12 and stored in the storage 11. The input device 13 is used for sending, to the host computer 6, information in relation to imaging conditions (parameters), pulse sequence, combination of images, and subtraction between images.

How to specify FOVs for the unfolding processing executed in the parallel imaging according to the present embodiment will now be explained in terms of its theory (refer to FIG. 6, for example).

Unlike the conventional, this unfolding processing is based on the technique of specifying a "planned FOV" in planning a scan, acquiring echo signals based on an "acquisition FOV" of which region is narrower than that of the "planned FOV," automatically specifying an "unfolding FOV" serving as an "intervening FOV" and having a region larger than a region of the "planned FOV," using this "unfolding FOV" to process image data into an image, and cutting out an image of a desired "final FOV" from the image of the "unfolding FOV." The "unfolding FOV" is specified independently of the "planned FOV." By way of example, the "final FOV" is equal in the size to the "planned FOV."

The relationship among those FOVs is as follows.

<Planned FOV> The "planned FOV," which is denoted as L_final, is an FOV representing a desired imaging region specified by an operation in planning a scan for setting various imaging conditions (parameters). When the scan plan is conducted, a reduction rate R for data acquisition (that is, a scale for the parallel imaging) is specified jointly.

<Acquisition FOV> The "acquisition FOV," which is denoted as L_acquis, is an FOV to be used for acquiring echo signals from each element coil and defined as L_acquis=L_final/R.

<Unfolding FOV> The "unfolding FOV (i.e., intervening FOV)" is denoted as L_unfold defined by L_unfold>L_final=R·L_acquis.

<Final FOV> The "final FOV," for example, corresponds to the "planned FOV" and an image of this final FOV is obtained by cutting out an image produced using the unfolding FOV. In this way, it is normal that the planned FOV is equal in the size to the final FOV (i.e., an FOV to be subjected to final imaging), but this is not a definitive list. If needed, it may be possible to specify a planned FOV not equal in the size to a final FOV (the planned FOV≠the final FOV).

Compared to how to use the above-listed FOVs, it can be said that the conventional use of FOVs in the unfolding processing is based on a restriction of "planned FOV"="folding FOV"="final FOV."

The present invention removes such a restriction and adopts a way of setting a relation that the "unfolding FOV" is larger in the size than the "final FOV (for example, "planned FOV)" (the "unfolding FOV">the "final FOV"). This improves the conventional drawback and provides a great advantage to practical use, as will be described below.

In the present invention, a region subjected to the unfolding necessary for the parallel imaging is expanded in an imaginary manner, so that the inventors term this way as an "Expanded Unfolding Technique."

Hence an unfolding scale R' on the "expanded unfolding technique" can be expressed as bellow.

$$R' = \text{L\_unfold} / \text{L\_aquis} > \text{L\_final} / \text{L\_aquis}$$
$$= (R \cdot \text{L\_aquis}) / \text{L\_aquis}$$
$$= R$$

That is, the unfolding scale R' is set to meet the numerical relationship of R'>R. Preferably, the unfolding scale R' is set to any integer to satisfy the relationship of R'>R. A practical example of the unfolding scale R' is Int(R)+1 (Int: integer part). For example, when R=2 is specified, the unfolding scale R' is set to any one of 3, 4, . . . , etc. When R=1.5 is specified, the unfolding scale R' is set to any one of 2, 3, . . . , etc. When R=3 is specified, the unfolding scale R' is set to any of 4, 5, 6, . . . , etc. Alternatively, the unfolding scale R' may be set to R'=Nc, in which Nc is the number of reception channels which is an upper limit of the unfolding scale R'.

However, when the scaling factor R' is too large, a "g" factor becomes large as well, resulting in a lowered SNR. In addition, the unfolding requires a sensitivity map of each element coil. Hence the unfolding scale R' should be a value less than a range in which there exist sensitivity maps for simply unfolding in all regions. By the way, the "g" factor is an indication showing a decrease in the SNR, which is due to the unfolding (refer to "Pruessman K, et at., SENSE: Sensitivity Encoding for Fast MRI, MRM 42:952–962, 1999")

Referring to FIGS. 5 to 8, the overall operation of the parallel imaging on the "expanded unfolding technique" will now be exemplified.

Figure 5:
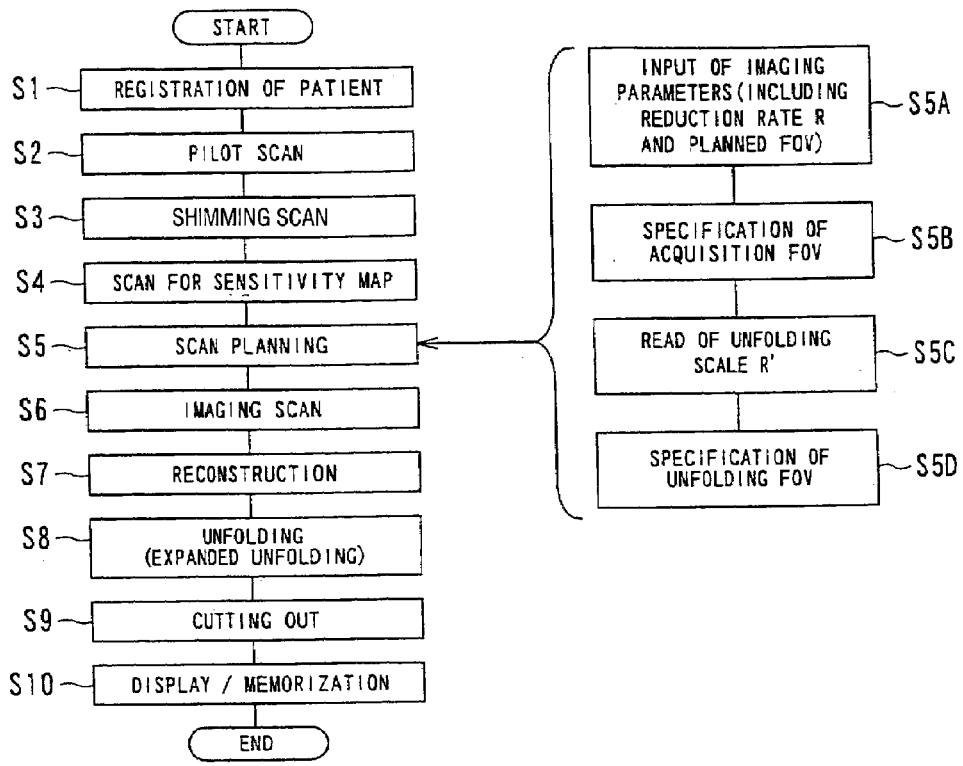
FIG. 5 is a flowchart outlining parallel imaging carried out in the first embodiment.

When the parallel imaging is commanded, the host computer 6 executes the processing in the procedures shown in FIG. 5.

First of all, the host computer 6 registers a patient using information coming from an operator (step S1). The host computer 6 then participates in a pilot scan for positioning, which is carried out using the whole-body coil 7T, whereby a positioning image is acquired (step S2). In cases where such a positioning image has already been acquired, the already-acquired positioning image can be used instead, thus omitting the pilot scan.

The host computer 6 executes the shimming scan (step S3), and then executes a sensitivity-map scan for acquiring sensitivity map data of the RF coils 7a to 7d serving as element coils (step S4). It is not always true that this sensitivity-map scan precedes the imaging scan later described. The sensitivity-map scan may be performed as part of a series of pulse trains prepared for the imaging scan.

After the above preparation scans are completed, the host computer 6 moves its operation to a scan plan (setting of the imaging conditions) (step S5A). During the scan plan, the host computer 6 behaves as an interface with an operator who observes the positioning image to interactively give necessary information.

Practically, at step S5A, the host computer 6 receives information in relation to both of a reduction rate for parallel imaging (i.e., a scale for the parallel imaging) and an FOV (field of view) specified by a ROI (region of interest) showing a desired imaging region (i.e., a planned FOV), in addition to information indicative of ordinary imaging parameters such as the type of a desired pulse sequence.

At step S5B, the microcomputer 6 makes a response to this reception such that the host computer 6 automatically computes an acquisition FOV and memorizes data of the computed acquisition FOV. At steps S5C and S5D, the host computer 6 reads out an appropriately predetermined unfolding scale R', and then uses the read-out unfolding scale R' to automatically compute data of an unfolding FOV. The data of the unfolding FOV is memorized.

After this, the host computer 6 makes the sequencer 5 perform a desired mode of parallel imaging as the imaging scan under the decided acquisition FOV (step S6). This imaging enables the microcomputer 6 to receive echo signals detected by the respective RF coils 7a to 7d and to reconstruct the echo signals into images in the actual space (step S7).

The microcomputer 6 applies unfolding possessing to each of the reconstructed images produced from the echo signals detected by the RF coils 7a to 7d, and then cuts out an image of a desired final FOV from each of the unfolded images (steps S8 and S9).

Figure 6:
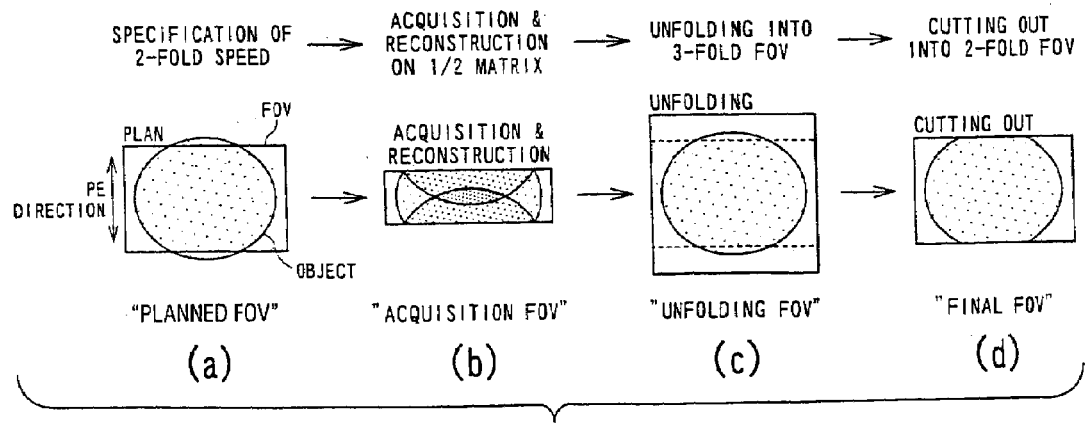
FIG. 6 explains a relationship between a set of FOVs (Field Of Views) (, which represent changes from an FOV specified in a scan plan to an FOV finally imaged) and sectional regions of an object to be scanned, the FOVs being directed to an expanded unfolding technique according to the first embodiment.

In connection with FIG. 6, the processing for the above unfolding and cutting will now be exemplified. FIG. 6 exemplifies a reduction rate (scale) R of 2 (i.e., two-fold speed) for parallel imaging. Under the situation where a planned FOV indicating a desired region to be imaged is specified on a positioning image (in this case, the planned FOV smaller than the existence region of an object is specified), parallel imaging is performed at the reduction rate R of 2 (in other words, subencoding data acquisition at the two-fold speed). Hence, using each of the RF coils 7a to 7d, data to be mapped in an acquisition FOV corresponding to ½ of the overall matrix is acquired (refer to FIG. 6(a) and (b)).

In this example of the present embodiment, in the magnetic resonance imaging system, an unfolding scale R' larger than the reduction rate R is specified automatically (with the operator unconscious of this automatic setting of the reduction rate R). For example, the unfolding scale R' is specified as three-fold speed (i.e., R'=3), and unfolding processing is applied to the unfolding FOV corresponding to R'=3, by using the sensitivity map data of each of the RF coils 7a to 7d (refer to FIG. 6(c)). In the imaging carried out in an ordinary fashion, the unfolding FOV corresponding to the unfolding scale R'=3 can contain, without fail, the existence region of an object to be imaged. Accordingly, the host computer 6 cuts out, from a real-space image of the unfolding FOV, an image of which size equals the desired planned FOV, whereby an image of which size equals a final FOV (i.e., in this case, the planned FOV) is produced (refer to FIG. 6(d)). This cutting-out processing is also executed automatically in the magnetic resonance imaging system (it is not required that the operator be conscious of the fact that the cutting-out processing is executed in the system).

A real-space image of the final FOV, which has been produced as above, is displayed on the display 12 and stored as image data into the storage 11 (step S10 in FIG. 5). This enables the operator to steadily observe the image of which size exactly corresponds to an FOV specified in the scan plan, with the operator unconscious of performing the expanded unfolding technique.

Figure 7:
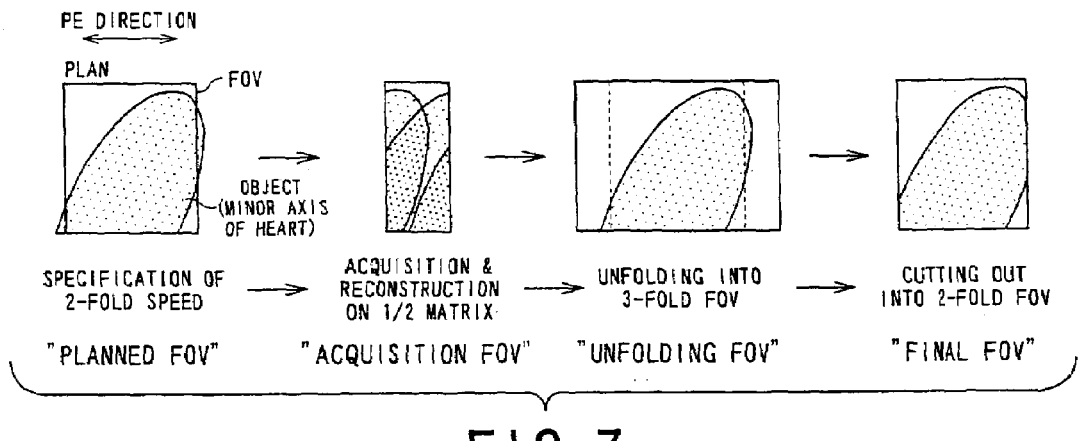
FIG. 7 explains an example of a relationship between a set of FOVs (, which represent changes from an FOV specified in a scan plan to an FOV finally imaged) and sectional regions of the heart of an object to be scanned, the sectional regions being along the minor axis of the heart and the FOVs being directed to the expanded unfolding technique according to the first embodiment.
Figure 8:
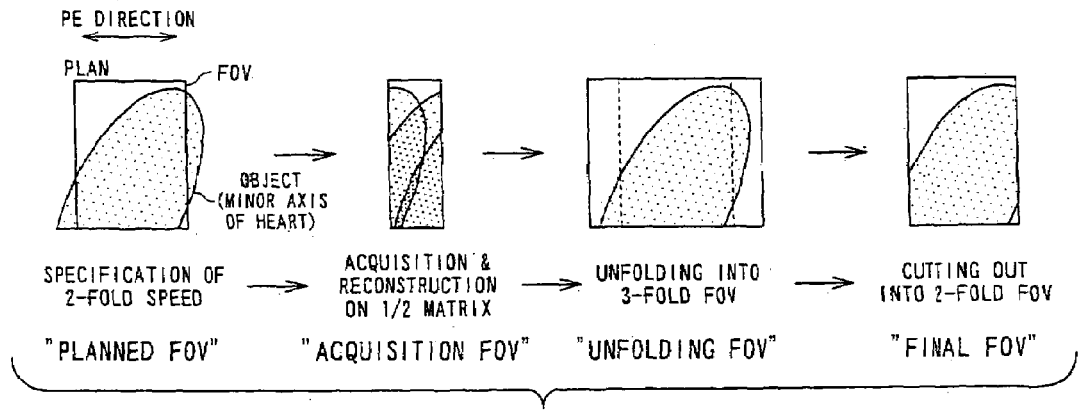
FIG. 8 explains another example of a relationship between a set of FOVs (, which represent changes from an FOV specified in a scan plan to an FOV finally imaged) and sectional regions of the heart of an object to be scanned, the sectional regions being along the minor axis of the heart and the FOVs being directed to the expanded unfolding technique according to the first embodiment.

Referring to FIGS. 7 and 8, some applications will now be explained, in which the foregoing expanded unfolding technique is applied to sections of the heart along its minor axis. In any case, assumptions are made such that a reduction rate R of 2 and an unfolding scale R' of 3 are specified and an initial minor-axial section of the heart is partially protruded from an FOV specified in planning a scan. In particular, compared to that in FIG. 7, the section in FIG. 8 shows that a planned FOV is too small to avoid the object from protruding, partially but to a large degree, from the boundary of the planned FOV. Employing the expanded unfolding technique, however, makes it possible to produce a desired final-FOV image in either case.

In this way, in the present embodiment, the expanded unfolding technique is employed, in which a region applied to the unfolding is made large in a virtual manner. Using this temporarily expanded region, there is produced an image in which folding artifacts are surely suppressed or prevented from remaining. The produced image is used to obtain a final-FOV image through the cutting processing.

As a result, even when a region to be imaged (i.e., a planned FOV) specified in a scan plan is incomplete due to the regional relationship with the existence of an object or is partially smaller than the existence region of an object (in other words, the object protrude in part from the planned FOV), setting the unfolding FOV allows the unfolding possessing to result in an optimum condition. It is therefore possible to provide higher-quality images with fewer artifacts.

From a different point of view, a region to be imaged (planned FOV) specified during a scan plan may be rough to some extent. Even in such a case, the magnetic resonance imaging system according to the present embodiment will automatically perform the expanded unfolding technique as one kind of internal processing (with no formal notification of the performance to the operator). Hence there is no longer necessary that the operator be as nervous as the conventional in specifying a region to be imaged. The labor and time for the manual specification can be saved, thus remarkably relieving the burden on the specification.

Second embodiment

Figure 9:
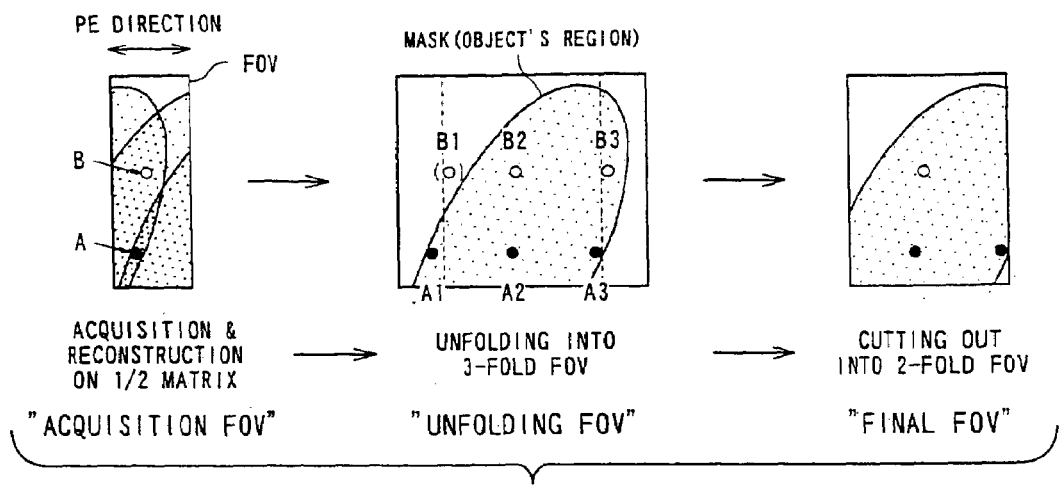
FIG. 9 explains an example of a relationship between a set of FOVs (, which represent changes from an FOV specified for data acquisition to an FOV finally imaged) and sectional regions of an object to be scanned, the FOVs being directed to an expanded unfolding technique according to a second embodiment, the expanded unfolding technique involving control of an unfolding scale based on a mask.
Figure 10:
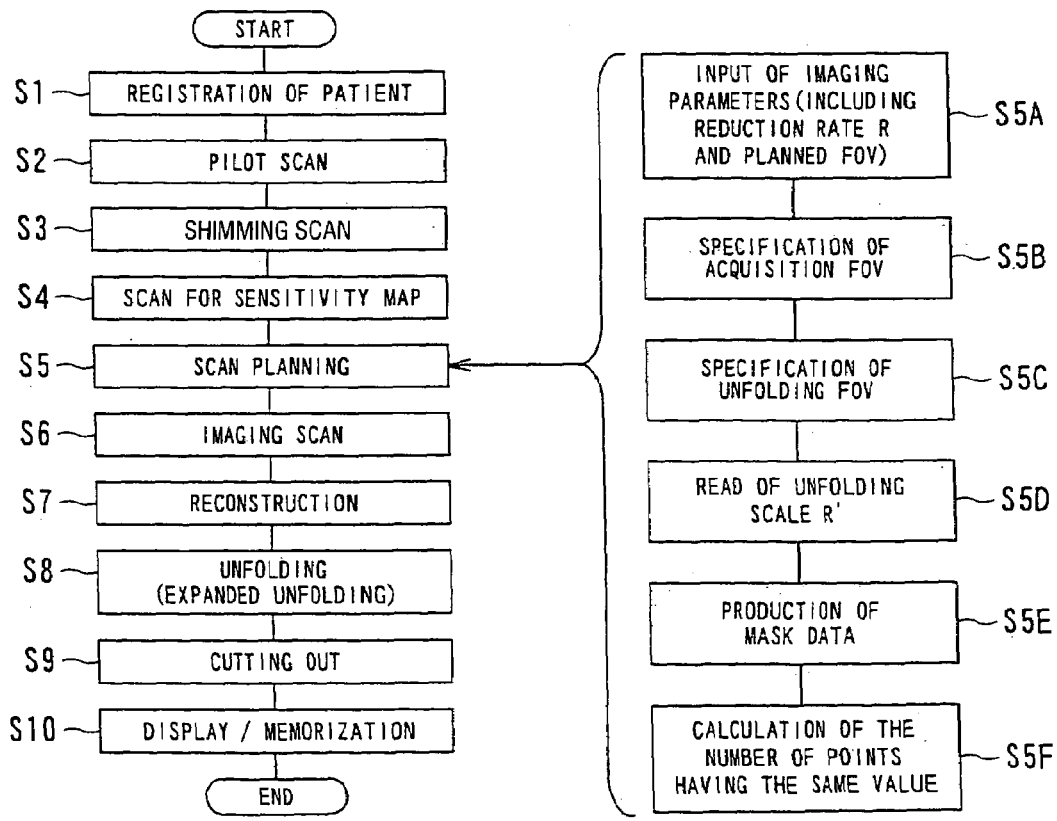
FIG. 10 is a flowchart outlining the parallel imaging carried out in the second embodiment.
Figure 11:
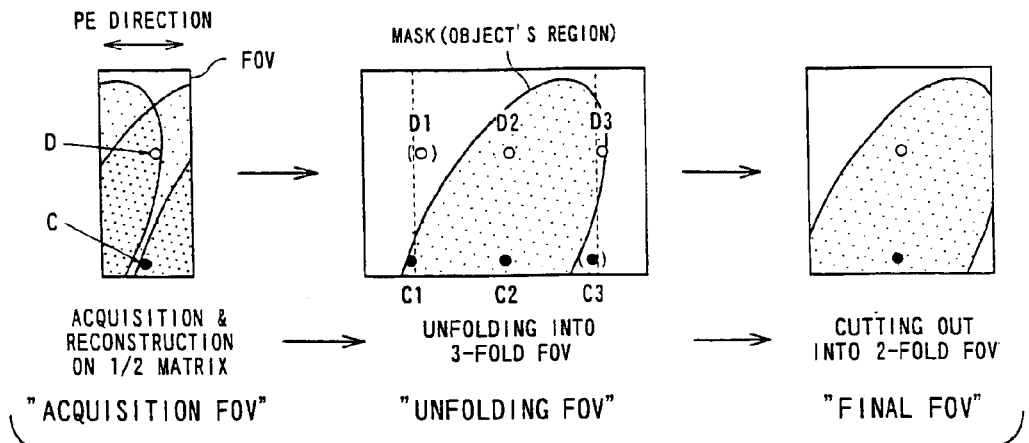
FIG. 11 explains another example of a relationship between a set of FOVs (, which represent changes from an FOV specified for data acquisition to an FOV finally imaged) and sectional regions of an object to be scanned, the FOVs being directed to an expanded unfolding technique according to the second embodiment, the expanded unfolding technique involving control of an unfolding scale based on a mask.

Referring to FIGS. 9 to 11, a second embodiment of the present invention will now be explained. The second embodiment is characteristic of performing the foregoing expanded unfolding technique together with controlling a scale based on mask information. A magnetic resonance imaging system according to the second embodiment is identical in its hardware to that used in the first embodiment.

First, control of a scale on mask information will now be explained. Though the expanded unfolding technique has been described in the first embodiment, the number of positions (i.e., pixels) at each of which the folding (i.e, aliasing) among the acquisition matrices is actually superposed changes position by position (i.e, pixel by pixel).

Hereinafter, for the sake of a simplified explanation, a set of positions satisfying an assumption that an object actually exists will be referred to as "mask." An explanation is given on the assumption that the shape of an object shown in FIG. 9 is identical to a mask.

In FIG. 9, at a position "A" in an "acquisition FOV," the folding is caused in such a manner that three positions A1, A2 and A3 mutually corresponding to each other in an "unfolding FOV" are superposed one on another. It is therefore necessary to perform, in fact, the unfolding processing at an unfolding scale of three-fold speed. As to a position "B," three positions B1, B2 and B3 are superposed one on another at the position "B," but no signal will emanate from the position B1 which is parenthesized. It is therefore possible to remove the position B1 from the unfolding calculation, so that, from a practical point of view, it is sufficient to apply the unfolding at an unfolding scale of two-fold speed to the calculation at the position B1.

Hence, with reference to information indicative of the foregoing mask region, the number of positions is calculated previously, at each of which the folding is superposed within an object's estimated existence region or a given expanded region including the object's estimated existence region (i.e., the previous calculation of the number of equivalent positions).

The expanded unfolding technique is applied to each pixel value of a reconstructed acquisition-FOV image at an unfolding scale depending on the number of equivalent positions at each pixel. For example, if the number of equivalent positions at a pixel is 2, the expanded unfolding at an unfolding scale of two-fold speed is performed, while, on the same image, if the number of equivalent positions at another pixel is 3, the expanded unfolding at an unfolding scale of three-fold speed is performed. A final FOV is used to produce a desired-size image by cutting an unfolding-FOV image in compliance with the FOV specified in the scan plan.

To use this mask processing technique in combination with the expanded unfolding technique, the host computer 6 performs parallel imaging according to the procedures outlined in FIG. 10. Compared to the foregoing procedures illustrated in FIG. 5, both of a scan plan at step S5 and the unfolding processing at step S8 are differentiated from those in FIG. 5. The processing at the remaining steps is similar or identical to that in FIG. 5.

In the scan plan, the host computer 6 manages the specification of imaging conditions, specification of an acquisition FOV, reading of an unfolding scale, and specification of an unfolding FOV (steps S5A to S5D). After these steps, the host computer 6 produces data of a mask precisely covering an object's existence region on a preparation image reconstructed from echo data acquired through a pilot scan (step S5E). Using both of the mask data and a reduction rate R of data acquisition time specified in the scan plan (step S5A), the host computer 6 calculates the number of equivalent positions at each of which the folding is caused (i.e., having the same pixel value) (step S5F). After the processes of an imaging scan and image reconstruction (steps S6 and S7), the expanded unfolding processing is executed, as described, with reference to the above-calculated number of equivalent positions (step S8).

As a result, as to the position "A" in FIG. 9 to which the three positions A1, A2 and A3 are actually folded back (for the conventional technique, the position "A" is an improperly unfolded point), the three-fold unfolding processing is conducted based on the expanded unfolding technique according to the present embodiment. In addition, as to the position "B" in FIG. 9 to which only the two positions B1 and B2 are actually folded back, the expanded unfolding technique to be applied is limited to the two-fold unfolding processing. That is, a deterioration in image quality (i.e., a decrease in SNR), which will be resulted from the meaningless three-fold unfolding, is prevented at the position "B."

In this way, through the pixel-basis control of the unfolding scale based on the mask information, the three-fold unfolding processing gives priority to prevention of the folding and the two-fold unfolding processing prevents the SNR from decreasing due to a swell in the "g" factor. Accordingly, the expanded unfolding has a sharp effectiveness.

Moreover, in a situation shown FIG. 11, this expanded unfolding technique in combination with the mask-based unfolding scale control also brings out a remarkable advantage. To be specific, although an object partially protrudes from both ends of a planned FOV (not shown), the number of actual folded positions at any location on an object is not more than 2, as understood from two representative locations "C" and "D." That is, since the two-fold unfolding processing is sufficient for any object's locations, a decrease in the SNR is suppressed and limited within an optimum range, while still providing final images with no folding.

Third embodiment

Figure 12:
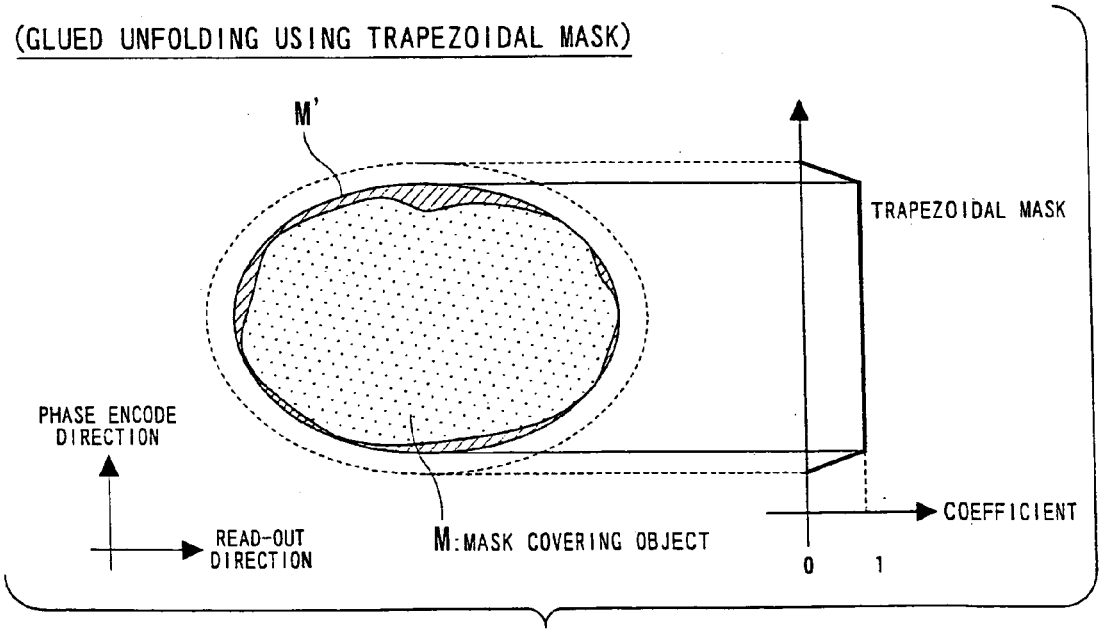
FIG. 12 explains an expanded unfolding technique carried out in a third embodiment of the present invention, using a glued unfolding technique based on a trapezoidal mask.

Referring to FIG. 12, a third embodiment according to the present invention will now be described. This embodiment is characteristic of avoiding a discontinuity in image quality in performing the expanded unfolding technique together with the unfolding scale control on mask information. Incidentally, a magnetic resonance imaging system according to the third embodiment has the same hardware configuration identical to that in the first embodiment.

In the foregoing second embodiment, the expanded unfolding technique has been explained under a condition that the unfolding scale is controlled on the pixel basis. To change the unfolding scale results in discontinuous changes in the "g" factor, with the result that image information may suffer large discontinuous changes which occur between adjacent pixels.

To avoid the discontinuity in the image quality on account of such a discontinuous change in the unfolding scales (i.e., integers), there is proposed an improved technique termed by the present inventors as a "glued unfolding technique." This glued unfolding technique adopts the principle that, in a boundary portion, two images of which unfolding scales change are continuously weighted and glued to each other.

In the present embodiment, the glued unfolding technique is reduced into practice as a "trapezoidal mask technique"

that uses a trapezoidal mask in conducting the glued unfolding technique. As shown in FIG. 12, an assumption is made such that a mask that exactly traces the outer contour of an object is denoted as M, a region encircling the mask M with an appropriate margin is denoted M', and a trapezoidal mask is denoted as T. The trapezoidal mask consists of weighting factors that represent "1" in the region M' but decreases from "1" along a trapezoidal function outside the region M' in each phase encode direction.

The host computer 6 performs additional processing, for example, at steps S5B and S8 in FIG. 10, in such a manner that the following processes [1] and [2] are sequentially calculated with respect to an "acquisition FOV" and resultant values E(yk) are mapped on an "unfolding-FOV" image.

[1] Positional coordinates yk (k=1, 2, . . . , R') which correspond to each other as to the folding are obtained. Assume that R1 denotes the number of T values (i.e., weighting factor) each satisfying a relation of T value=1, R2 denotes the number of T values each satisfying a relation of 0<T value≦1, and r=ΣT(yk) (0≦R1≦r≦R2).

[2] As to yk of T(yk)=0, a value satisfying E(yk)=0 is to be obtained. On the assumption that there is yk meeting a condition of T(yk)>0, E(yk) directed to each position T(yk) is computed.

[2.1] In the case of 0<R1=R2 (i.e., a set of positions each satisfying T(yk)=1):

The unfolding is performed at an unfolding scale of R1-fold, resultant unfolded values being E1(yk). As to corresponding yk, the value E(yk) is set to E(yk)=E1(yk).

[2.2] In the case of 0=R1<R2) (i.e., a set of positions each satisfying T(yk)<1):

The unfolding is performed at an unfolding scale of R2-fold, resultant unfolded values being E2(yk). As to corresponding yk, the value E(yk) is calculated on E(yk)=T(yk)·E2(yk).

[2.3] In the case of 0<R1<R2 (i.e., a set of positions satisfying T(yk)=1 and T(yk)<1 exist in a mixed manner):

The unfolding is performed at an unfolding scale of R1-fold and at an unfolding scale of R2-fold, resultant unfolded values being E1(yk) and E2(yk), respectively.

As to corresponding yk, the value E(yk) is obtained as follows.

When T(yk)=1, $$E(yk)=((r-R1)/(R2-R1))*E1(yk)+((R2-r)/(R2-R1))*E2(yk).$$

When T(yk)<1, $$E(yk)=T(yk)*E2(yk).$$

The above shows the way of linearly changing the weighting factor T, but this is not a definitive list. An alternative is to change the weighting factor in a sinusoidal pattern.

The trapezoidal mask is practical, because the functional values defining the mask can contain all data necessary for gluing processing which sequentially follows the unfolding processing on the glued unfolding technique.

The present invention may be embodied in other specific forms without departing from the spirit or essential characteristics thereof. The present embodiments are therefore to be considered in all respects as illustrative and not restrictive, the scope of the present invention being indicated by the appended claims rather than by the foregoing description and all changes which come within the meaning and range of equivalency of the claims are therefore intended to be embraced therein.

The entire disclosure of Japanese Patent Application Ser. No. 2003-130408 filed on May 8, 2003 including the specification, claims, drawings and summary are incorporated herein by reference in its entirety.

What is claimed is:

1. A magnetic resonance imaging system configured to perform parallel imaging with an object to be imaged, said system comprising:
    an imaging region specification unit configured to specify a desired imaging region;
    a plurality of element coils configured to receive RF signals based on the desired imaging region;
    a reconstruction unit configured to reconstruct a first image based on the RF signals;
    an unfolding unit configured to unfold the first image into a second image having an unfolding region larger in size than the desired imaging region; and
    an image production unit configured to produce a third image having the desired imaging region based on the second image.

2. The magnetic resonance imaging system according to claim 1 wherein the image production unit is configured to cut out the third image from the second image.

3. The magnetic resonance imaging system according to claim 2 wherein:
    the imaging region specification unit is configured to specify a reduction rate of a data acquisition time for the parallel imaging; and
    the reconstruction unit is configured to reconstruct the first image based on the reduction rate.

4. The magnetic resonance imaging system according to claim 3 wherein the unfolding unit is configured to unfold the first image into the second image based on an unfolding scale larger in numerical value than the reduction rate.

5. The magnetic resonance imaging system according to claim 4 wherein the unfolding scale is an integer.

6. The magnetic resonance imaging system according to claim 4 further comprising an estimation unit configured to estimate an existence region of the object in real space,
    wherein the unfolding unit is configured to unfold the first image into the second image based on the existence region.

7. The magnetic resonance imaging system according to claim 6 wherein the estimation unit is configured to estimate the existence region from RF signals received in a pre-scan, the pre-scan being carried out before an imaging scan.

8. The magnetic resonance imaging system according to claim 7 wherein at least one of the RF signals received in the pre-scan is sent from a whole body coil.

9. The magnetic resonance imaging system according to claim 6 wherein the unfolding unit is configured to obtain the number of equivalent folded positions in the existence region or a region enlarged to include the existence region and to unfold the first image into the second image based on the number of equivalent fold positions.

10. The magnetic resonance imaging system according to claim 6 further comprising a continuity securement unit configured to secure continuity of pixel values in an otherwise pixel-value-discontinuous area on the second image, the unfolding scale being changed discontinuously in the pixel-value-discontinuous area.

11. The magnetic resonance imaging system according to claim 10 wherein the continuity securement unit is configured to mutually glue together different second images which are unfolded at different scales and subjected to smooth weighting in the pixel-value-discontinuous area.

12. The magnetic resonance imaging system according to claim 11 wherein the continuity securement unit uses a trapezoidal mask to give smooth weighting to pixel values in the pixel-value-discontinuous area.

13. The magnetic resonance imaging system according to claim 1 further comprising an image display unit configured to display the third image.

14. The magnetic resonance imaging system according to claim 1 further comprising an image storage unit configured to store the third image.

15. The magnetic resonance imaging system according to claim 1 wherein:
the imaging region specification unit is configured to specify a reduction rate for data acquisition time for parallel imaging; and
the reconstruction unit is configured to reconstruct the first image based on the reduction rate.

16. The magnetic resonance imaging system according to claim 15 wherein the unfolding unit is configured to unfold the first image into the second image based on an unfolding scale larger in numerical value than the reduction rate.

17. The magnetic resonance imaging system according to claim 16 wherein the unfolding scale is an integer.

18. The magnetic resonance imaging system according to claim 16 further comprising an estimation unit configured to estimate an existence region of the object in real space,
wherein the unfolding unit is configured to unfold the first image into the second image based on the existence region.

19. The magnetic resonance imaging system according to claim 18 wherein the estimation unit is configured to estimate the existence region from RF signals received in a pre-scan, the pre-scan being carried out before an imaging scan.

20. The magnetic resonance imaging system according to claim 19 wherein at least one of the RF signals received in the pre-scan is sent from a whole body coil.

21. The magnetic resonance imaging system according to claim 18 wherein the unfolding unit is configured to obtain a number of equivalent folded positions in the existence region or a region enlarged to include the existence region and to unfold the first image into the second image based on the number of equivalent fold positions.

22. The magnetic resonance imaging system according to claim 18 further comprising a continuity securement unit configured to secure a continuity of pixel values in an otherwise pixel-value-discontinuous area on the second image, the unfolding scale being changed discontinuously in the pixel-value-discontinuous area.

23. The magnetic resonance imaging system according to claim 22 wherein the continuity securement unit is configured to mutually glue together different second images which are unfolded at different scales and subjected to smooth weighting in the pixel-value-discontinuous area.

24. The magnetic resonance imaging system according to claim 23 wherein the continuity securement unit uses a trapezoidal mask to give smooth weighting to pixel values in the pixel-value-discontinuous area.

25. A magnetic resonance imaging system for performing parallel imaging with an object to be imaged, said system comprising:
an imaging region specification means for specifying a desired imaging region;
a plurality of element coils configured to receive RF signals based on the desired imaging region;
reconstruction means for reconstructing a first image based on the RF signals;
unfolding means for unfolding the first image into a second image having an unfolding region larger in size than the desired imaging region; and
image production means for producing a third image having the desired imaging region based on the second image.

26. The magnetic resonance imaging system according to claim 25 wherein the image production means is configured to cut out the third image from the second image.

27. The magnetic resonance imaging system according to claim 26 wherein:
the imaging region specification means is configured to specify a reduction rate of data acquisition time for parallel imaging; and
the reconstruction means is configured to reconstruct the first image based on the reduction rate.

28. The magnetic resonance imaging system according to claim 27 wherein the unfolding means is configured to unfold the first image into the second image based on an unfolding scale larger in numerical value than the reduction rate.

29. The magnetic resonance imaging system according to claim 28 wherein the unfolding scale is an integer.

30. The magnetic resonance imaging system according to claim 28 further comprising estimation means for estimating an existence region of the object in real space,
wherein the unfolding means is configured to unfold the first image into the second image based on the existence region.

31. The magnetic resonance imaging system according to claim 30 wherein the estimation means is configured to estimate the existence region from RF signals received in a pre-scan, the pre-scan being carried out before an imaging scan.

32. The magnetic resonance imaging system according to claim 31 wherein at least one of the RF signals received in the pre-scan is sent from a whole body coil.

33. The magnetic resonance imaging system according to claim 30 wherein the unfolding means is configured to obtain a number of equivalent folded positions in the existence region or a region enlarged to include the existence region and to unfold the first image into the second image based on the number of equivalent fold positions.

34. The magnetic resonance imaging system according to claim 30 further comprising continuity securement means for securing continuity of pixel values in an otherwise pixel-value-discontinuous area on the second image, the unfolding scale being changed discontinuously in the pixel-value-discontinuous area.

35. The magnetic resonance imaging system according to claim 34 wherein the continuity securement means is configured to mutually glue together different second images which are unfolded at different scales and subjected to smooth weighting in the pixel-value-discontinuous area.

36. The magnetic resonance imaging system according to claim 35 wherein the continuity securement means uses a trapezoidal mask to give smooth weighting to pixel values in the pixel-value-discontinuous area.

37. The magnetic resonance imaging system according to claim 25 further comprising image display means displaying the third image.

38. The magnetic resonance imaging system according to claim 25 further comprising image storage means for storing the third image.

39. The magnetic resonance imaging system according to claim 25 wherein:
the imaging region specification means is configured to specify a reduction rate of a data acquisition time for the parallel imaging; and
the reconstruction means is configured to reconstruct the first image based on the reduction rate.

40. The magnetic resonance imaging system according to claim 39 wherein the unfolding means is configured to unfold the first image into the second image based on an unfolding scale larger in numerical value than the reduction rate.

41. The magnetic resonance imaging system according to claim 40 wherein the unfolding scale is an integer.

42. The magnetic resonance imaging system according to claim 40 further comprising estimation means estimating an existence region of the object in real space,
wherein the unfolding means is configured to unfold the first image into the second image based on the existence region.

43. The magnetic resonance imaging system according to claim 42 wherein the estimation means is configured to estimate the existence region from RF signals received in a pre-scan, the pre-scan being carried out before an imaging scan.

44. The magnetic resonance imaging system according to claim 43 wherein at least one of the RF signals received in the pre-scan is sent from a whole body coil.

45. The magnetic resonance imaging system according to claim 42 wherein the unfolding means is configured to obtain a number of equivalent folded positions in the existence region or a region enlarged to include the existence region and to unfold the first image into the second image based on the number of equivalent fold positions.

46. The magnetic resonance imaging system according to claim 42 further comprising continuity securement means for securing a continuity of pixel values in an otherwise pixel-value-discontinuous area on the second image, the unfolding scale being changed discontinuously in the pixel-value-discontinuous area.

47. The magnetic resonance imaging system according to claim 46 wherein the continuity securement means is configured to mutually glue together different second images which are unfolded at different scales and subjected to smooth weighting in the pixel-value-discontinuous area.

48. The magnetic resonance imaging system according to claim 47 wherein the continuity securement means uses a trapezoidal mask to give smooth weighting to pixel values in the pixel-value-discontinuous area.

49. A magnetic resonance imaging method of performing parallel imaging with an object to be imaged, the parallel imaging using RF signals received by a plurality of element coils placed to receive the RF signals from the object, from the object, said method comprising:
specifying a desired imaging region;
receiving RF signals based on the desired imaging region;
reconstructing a first image based on the RF signals;
unfolding the first image into a second image having an unfolding region larger in size than the desired imaging region; and
producing a third image having the desired imaging region based on the second image.

50. The method according to claim 49, wherein the image production step cuts out the third image from the second image.

51. The method according to claim 50, wherein:
the imaging region specification step specifies a reduction rate of a data acquisition time for the parallel imaging; and
the reconstruction unit step reconstructs the first image based on the reduction rate.

52. The method according to claim 51 wherein the unfolding step unfolds the first image into the second image based on an unfolding scale larger in numerical value than the reduction rate.

53. The method according to claim 52 wherein the unfolding scale is an integer.

54. The method according to claim 52 further comprising an estimation step estimating an existence region of the object in real space,
wherein the unfolding step unfolds the first image into the second image based on the existence region.

55. The method according to claim 54 wherein the estimation step estimates the existence region from RF signals received in a pre-scan, the pre-scan being carried out before an imaging scan.

56. The method according to claim 55 wherein at least one of the RF signals received in the pre-scan is sent from a whole body coil.

57. The method according to claim 54 wherein the unfolding step obtains the number of equivalent folded positions in the existence region or a region enlarged to include the existence region and unfolds the first image into the second image based on the number of equivalent fold positions.

58. The method according to claim 54 further comprising a continuity securement step secures a continuity of pixel values in an otherwise pixel-value-discontinuous area on the second image, the unfolding scale being changed discontinuously in the pixel-value-discontinuous area.

59. The method according to claim 58 wherein the continuity securement step mutually glues together different second images which are unfolded at different scales and subjected to smooth weighting in the pixel-value-discontinuous area.

60. The method according to claim 59 wherein the continuity securement step uses a trapezoidal mask to give smooth weighting to pixel values in the pixel-value-discontinuous area.

61. The method according to claim 49 further comprising an image display step displaying the third image.

62. The method according to claim 49 further comprising an image storage step storing the third image.

63. The method according to claim 49 wherein:
the imaging region specification step specifies a reduction rate of a data acquisition time for the parallel imaging; and
the reconstruction step reconstructs the first image based on the reduction rate.

64. The method according to claim 63 wherein the unfolding step unfolds the first image into the second image based on an unfolding scale larger in numerical value than the reduction rate.

65. The method according to claim 64 wherein the unfolding scale is an integer.

66. The method according to claim 64 further comprising an estimation step estimates an existence region of the object in real space,
wherein the unfolding step unfolds the first image into the second image based on the existence region.

67. The method according to claim 66 wherein the estimation step estimates the existence region from RF signals received in a pre-scan, the pre-scan being carried out before an imaging scan.

68. The method according to claim 67 wherein at least one of the RF signals received in the pre-scan is sent from a whole body coil.

69. The method according to claim 66 wherein the unfolding step obtains a number of equivalent folded positions in the existence region or a region enlarged to include the existence region and unfolds the first image into the second image based on the number of equivalent fold positions.

70. The method according to claim 66 further comprising a continuity securement step secures a continuity of pixel values in an otherwise pixel-value-discontinuous area on the second image, the unfolding scale being changed discontinuously in the pixel-value-discontinuous area.

71. The method according to claim 70 wherein the continuity securement step mutually glues together different second images which are unfolded at different scales and subjected to smooth weighting in the pixel-value-discontinuous area.

72. The method according to claim 71 wherein the continuity securement step uses a trapezoidal mask to give smooth weighting to pixel values in the pixel-value-discontinuous area.

* * * * *